(12) United States Patent
Camacho et al.

(10) Patent No.: US 8,455,993 B2
(45) Date of Patent: Jun. 4, 2013

(54) INTEGRATED CIRCUIT PACKAGING SYSTEM WITH MULTIPLE ROW LEADS AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 254 days.

(21) Appl. No.: 12/789,077

(22) Filed: May 27, 2010

(65) Prior Publication Data
US 2011/0291251 A1 Dec. 1, 2011

(51) Int. Cl.
*H01L 23/482* (2006.01)

(52) U.S. Cl.
USPC .......... 257/692; 257/676; 257/E23.031; 438/123

(58) Field of Classification Search
USPC .......... 257/666, 676, 692, E23.031, E23.043; 438/123
See application file for complete search history.

(56) References Cited

U.S. PATENT DOCUMENTS

| | | | |
|---|---|---|---|
| 5,656,550 A | 8/1997 | Tsuji et al. | |
| 7,019,388 B2 | 3/2006 | Ito et al. | |
| 7,208,817 B2 | 4/2007 | Ito et al. | |
| 7,217,991 B1 | 5/2007 | Davis | |
| 7,342,318 B2 | 3/2008 | Huang et al. | |
| 7,602,053 B2 | 10/2009 | Huang et al. | |
| 7,671,474 B2 | 3/2010 | Dirks | |
| 8,294,249 B2* | 10/2012 | Pilling et al. | 257/676 |
| 2001/0045629 A1* | 11/2001 | Corisis | 257/666 |
| 2002/0180008 A1* | 12/2002 | Corisis | 257/666 |
| 2003/0111717 A1* | 6/2003 | Ito et al. | 257/678 |
| 2004/0232528 A1* | 11/2004 | Ito et al. | 257/666 |
| 2005/0189627 A1* | 9/2005 | Ito et al. | 257/666 |
| 2006/0105501 A1* | 5/2006 | Kuah et al. | 438/123 |
| 2008/0029862 A1* | 2/2008 | Filoteo et al. | 257/676 |
| 2008/0185693 A1* | 8/2008 | Punzalan et al. | 257/676 |
| 2010/0032818 A1* | 2/2010 | Pilling et al. | 257/676 |
| 2011/0068448 A1* | 3/2011 | Camacho et al. | 257/676 |

* cited by examiner

*Primary Examiner* — Allan R Wilson
(74) *Attorney, Agent, or Firm* — Ishimaru & Associates LLP

(57) ABSTRACT

A method of manufacture of an integrated circuit packaging system includes: forming a first lead adjacent and staggered to a second lead, the first lead having a first external connection portion with a first external conductive layer and a first internal connection portion, the first external connection portion oriented laterally outwards from the first internal connection portion, and the second lead having a second external connection portion with a second external conductive layer and a second internal connection portion; connecting an integrated circuit device with the first internal connection portion and with the second internal connection portion; forming an encapsulation over the integrated circuit device with the first lead and the second lead exposed; and forming a solder mask on the encapsulation, on the first lead, and on the second lead with the first external conductive layer and the second external conductive layer exposed from the solder mask.

17 Claims, 6 Drawing Sheets

INTEGRATED CIRCUIT PACKAGING SYSTEM WITH MULTIPLE ROW LEADS AND METHOD OF MANUFACTURE THEREOF

TECHNICAL FIELD

The present invention relates generally to an integrated circuit packaging system, and more particularly to a system for multiple row leaded packages.

BACKGROUND ART

Market growth for high density and high output/input integrated circuit packages has resulted in a trend for electronic products that are lightweight, smaller in size, multi-functional, and capable of ever increasing higher speeds. Electronic products such as cell phone base products, global positioning systems (GPS), satellites, communication equipment, consumer products, and a vast line of other similar products are in ever increasing global demand.

Products must be capable of competing in world markets and attracting many consumers or buyers. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a first lead adjacent and staggered to a second lead, the first lead having a first external connection portion with a first external conductive layer and a first internal connection portion, the first external connection portion oriented laterally outwards from the first internal connection portion, and the second lead having a second external connection portion with a second external conductive layer and a second internal connection portion; connecting an integrated circuit device with the first internal connection portion and with the second internal connection portion; forming an encapsulation over the integrated circuit device with the first lead and the second lead exposed; and forming a solder mask on the encapsulation, on the first lead, and on the second lead with the first external conductive layer and the second external conductive layer exposed from the solder mask.

The present invention provides an integrated circuit packaging system, including: a first lead having a first external connection portion with a first external conductive layer and a first internal connection portion, the first external connection portion oriented laterally outwards from the first internal connection portion; a second lead formed adjacent and staggered to the first lead, the second lead having a second external connection portion with a second external conductive layer and a second internal connection portion; an integrated circuit device connected with the first internal connection portion and with the second internal connection portion; an encapsulation formed over the integrated circuit device with the first lead and the second lead exposed; and a solder mask formed on the encapsulation, on the first lead, and on the second lead with the first external conductive layer and the second external conductive layer exposed from the solder mask.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
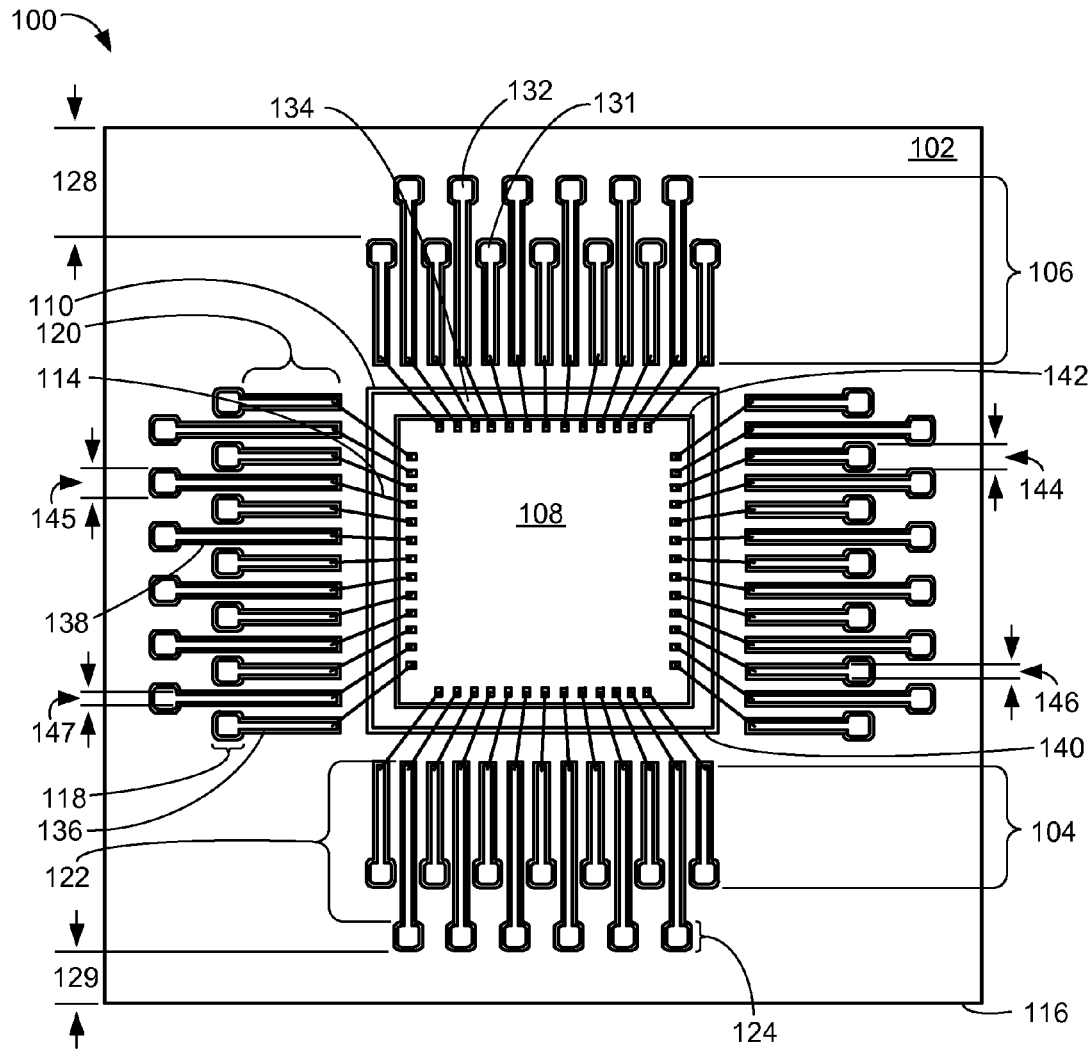
FIG. 1 is a top plan view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top plan view of an integrated circuit packaging system 100 in a first embodiment of the present invention. The top plan view depicts the integrated circuit packaging system 100 without a portion of an encapsulation 102 to expose first leads 104, second leads 106, an integrated circuit device 108, a die pad 110, and internal interconnects 114.

The integrated circuit device 108 is an integrated circuit having a non-active side and an active side having circuitry fabricated thereon. The integrated circuit device 108 can include a wire bond chip, an integrated circuit module, or any integrated component having electronic circuitry.

The internal interconnects 114 is defined as an electrical structure for mechanically and electrically connecting two end points, and for use internal to the encapsulation 102 of the integrated circuit packaging system 100 but not part of the integrated circuit device 108. The encapsulation 102 is defined as a cover over the first leads 104, the second leads 106, the integrated circuit device 108, the die pad 110, and the internal interconnects 114. The encapsulation 102 also protects these portions of the integrated circuit packaging system 100 by providing a hermetic seal.

The first leads 104 can be formed from copper, conductive alloys, or of a material having properties similar to copper materials. The first leads 104 can be oriented adjacent the die pad 110 which can be formed of the same material used to form the first leads 104. The die pad 110 can provide structural and conductive properties to the integrated circuit packaging system 100.

The first leads 104 are not attached to and extend perpendicularly from the die pad 110 towards perimeter sides 116 of the encapsulation 102 closest to the first leads 104. Each of the first leads 104 can include a first external connection portion 118 and a first internal connection portion 120.

The first external connection portion 118 can be closer to the peripheral of the integrated circuit packaging system 100 than the first internal connection portion 120. The first internal connection portion 120 can extend laterally from the first external connection portion 118 inward towards the die pad 110. The first internal connection portion 120 can be used to redistribute electrical signals or electrical potential levels from one location to a different location within the present invention.

The first external connection portion 118 of the first leads 104 can be oriented with a first offset 128. The first offset 128 is defined as a distance between the first external connection portion 118 and the perimeter sides 116 closest to the first external connection portion 118.

The second leads 106 can be oriented adjacent to, staggered to, and at alternating locations with the first leads 104. The second leads 106 can be formed from a material similar the material used to form the first leads 104. The second leads 106 are not attached to and extend perpendicularly from the die pad 110 towards the perimeter sides 116 of the encapsulation 102 closest to the second leads 106.

The second leads 106 can be formed to include a second external connection portion 124 and a second internal connection portion 122. The second external connection portion 124 can be closer to the peripheral of the integrated circuit packaging system 100 than the second internal connection portion 122. The second internal connection portion 122 can extend laterally from the second external connection portion 124 inward towards the die pad 110.

For illustrative purposes, the present embodiment is shown with the second internal connection portion 122 having a length different from a length of the first internal connection portion 120.

The second external connection portion 124 can be oriented with a second offset 129. The second offset 129 is defined as a distance between the second external connection portion 124 and the perimeter sides 116 closest to the second external connection portion 124.

The first offset 128 is different from the second offset 129 such that the first leads 104 are shown to form an inner row of external connections with the first external connection portion 118 and the second leads 106 are shown to form an outer row of external connections with the second external connection portion 124. The first internal connection portion 120 and the second internal connection portion 122, in an adjacent location to the first internal connection portion 120, can be equidistant from the edge of the die pad 110.

The first leads 104 include a first internal conductive layer 131. The second leads 106 include a second internal conductive layer 132. The die pad 110 includes a die internal conductive layer 134.

The first internal conductive layer 131, the second internal conductive layer 132, and the die internal conductive layer 134 improves conductive properties, connective properties, and oxidation resistance of the first leads 104, the second leads 106, and the die pad 110, respectively. Also the first internal conductive layer 131, the second internal conductive layer 132, and the die internal conductive layer 134 is used as an etchant resist coating to form the first leads 104, the second leads 106, and the die pad 110, respectively.

The first internal conductive layer 131, the second internal conductive layer 132, and the die internal conductive layer 134 can be formed using a pre-plated frame (PPF) process that includes a nickel-palladium-gold (NiPdAu) layering process or a layering process using conductive metals having characteristics similar to a combination of NiPdAu. A first upper non-horizontal portion 136 of the first leads 104, a second upper non-horizontal portion 138 of the second leads 106, and an upper non-horizontal pad side 140 of the die pad 110 are shown in the top plan view.

The top plan view depicts the first internal conductive layer 131 surrounded by the first upper non-horizontal portion 136 of the first leads 104. The top plan view also depicts the second internal conductive layer 132 surrounded by the second upper non-horizontal portion 138 of the second leads 106. The die internal conductive layer 134 is shown surrounded by the upper non-horizontal pad side 140 of the die pad 110.

The integrated circuit device 108 can be mounted over the die internal conductive layer 134 of the die pad 110 using an attachment layer 142 that can include an adhesive layer, a stacking adhesive, or a combination thereof. The attachment layer 142 is used to attach the integrated circuit device 108 onto the die pad 110 such that the integrated circuit device 108 will remain stationary during the forming of the encapsulation 102.

The internal interconnects 114 can be used to electrically connect the active side of the integrated circuit device 108 with the first internal conductive layer 131 of the first leads 104 and the second internal conductive layer 132 of the second leads 106. One or more of the internal interconnects 114 could optionally be used to connect the integrated circuit device 108 to the die internal conductive layer 134 of the die pad 110.

Each of the internal interconnects 114 are shown having a minimized length resulting from connecting to the first internal conductive layer 131 nearest ends of the first internal connection portion 120 closest to the die pad 110 as opposed to the connecting to the first external connection portion 118. Also, the minimal length of the internal interconnects 114 can be achieved by connecting the second internal conductive layer 132 nearest ends of the second internal connection portion 122 closest to the die pad 110. Some of the internal interconnects 114 could have been connected to the first internal conductive layer 131 or the second internal conductive layer 132 at any physical location to provide more than one of the internal interconnects 114 with equal lengths for electrical timing sensitive signals to or from the integrated circuit device 108.

A portion of the first external connection portion 118 and the second external connection portion 124 protrude towards a side of the integrated circuit packaging system 100 opposite the side facing the encapsulation 102. The portion of the first external connection portion 118 and the second external connection portion 124 can be used to provide connectivity between the integrated circuit packaging system 100 and a next level of integration (not shown), such as a printed circuit board, an integrated circuit module, or a subsystem having electronics.

The first external connection portion 118 of each of the first leads 104 are staggered from the second external connection portion 124 of each of the second leads 106. A first external width 144 of the first external connection portion 118 can be at least twice a first internal width 146 of the first internal connection portion 120.

A second external width 145 of the second external connection portion 124 can be at least twice a second internal width 147 of the second internal connection portion 122. The first internal width 146 can be equal to the second internal width 147.

The first external width 144 of the first external connection portion 118 being wider than the first internal width 146 width of the first internal connection portion 120 accommodates the input/output density differences between what a system level connection will permit versus the input/output density of the integrated circuit device 108.

Also, the second external width 145 of the second external connection portion 124 being wider than the second internal width 147 of the second internal connection portion 122, respectively, accommodates the input/output density differences between what a system level connection will permit versus the input/output density of the integrated circuit device 108.

As input and output circuit density of the integrated circuit device 108 increases, dimensions of the first internal connection portion 120 and the second internal connection portion 122 can be adjusted to accommodate the densities of the packaging technologies of the integrated circuit packaging system 100. The input and output circuit density is further distributed from the package densities to the system level densities by providing multiple rows of the first external connection portion 118 and the second external connection portion 124.

It has been discovered that the present invention provides the integrated circuit packaging system 100 with the capability of supporting different sized die footprints without a change in overall packaging footprint and physical connectivity to the next level of integration. Lengths of the first internal connection portion 120 and lengths of the second internal connection portion 122 can be formed to other lengths to accommodate a further integrated circuit device having a size and a footprint different from a size and a footprint of the integrated circuit device 108. The physical orientations and locations of the first external connection portion 118 and the second external connection portion 124 of the integrated circuit packaging system 100 remains unchanged with other dice having footprints different form the footprint of the present invention.

It has also been discovered that the present invention provides the integrated circuit packaging system 100 with significant performance capabilities. Lengths of the internal interconnects 114 can be constrained by forming the first internal connection portion 120 of the first leads 104 and the second internal connection portion 122 of the second leads 106 to pre-determined lengths. For example, the lengths of the internal interconnects 114 can be reduced by increasing the lengths of the first internal connection portion 120 and the second internal connection portion 122. In another example, circuitry having signal propagation timing problems, such as with a bus skew or differential clock signal skew problem, can be resolved by forming lengths of the first internal connection portion 120 or the second internal connection portion 122 to different lengths to compensate for skew or timing related problems due to variations in lengths of the internal interconnects 114.

It has further been discovered that the present invention can provide the integrated circuit packaging system 100 with substantial improvements in product yield and reliability. The first leads 104 and the second leads 106 are formed to enable the internal interconnects 114 to be routed having short lengths and without shorts. The first internal conductive layer 131 on the first internal connection portion 120 and the second internal conductive layer 132 on the second internal connection portion 122 provide many connection areas for connection with the internal interconnects 114. The many connection areas provide a multitude of degrees of freedom for the routing and connecting of the internal interconnects 114 while minimizing the lengths and eliminating shorting of the internal interconnects 114 for high product yield and reliability of the integrated circuit packaging system 100.

It has been yet further discovered that the present invention provides the integrated circuit packaging system 100 with savings in production costs. The first leads 104 and the second leads 106 can oriented to prevent shorting and bonding layout issues of the internal interconnects 114 during the assembly of the present invention and thus eliminate costs associated with component rework or material scrap. The first leads 104 and the second leads 106 can potentially reduce package connectivity costs over ball grid array (BGA) packages. The first leads 104 and the second leads 106 can reduce lengths of the internal interconnects 114 by more than 50% over typical multiple row quad flat no lead packages and thus provide savings in material usage of the internal interconnects 114.

Figure 2:
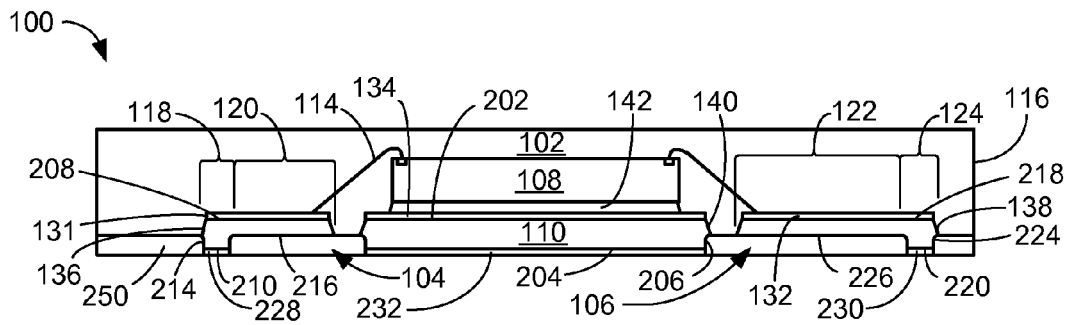
FIG. 2 is a cross-sectional view of the integrated circuit packaging system taken along a line 2-2 of FIG. 3.
Figure 3:
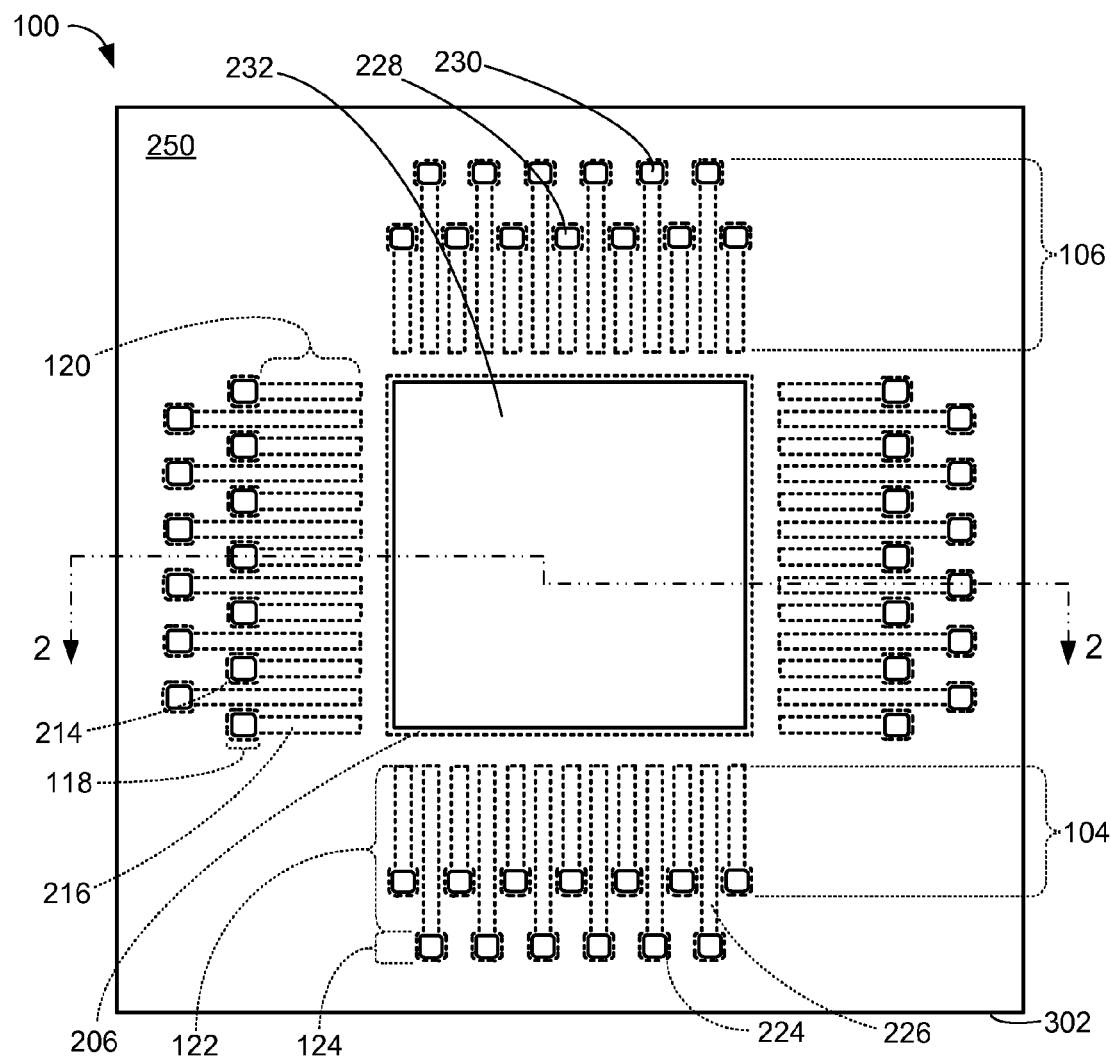
FIG. 3 is a bottom view of the integrated circuit packaging system.

Referring now to FIG. 2, therein is shown a cross-sectional view of the integrated circuit packaging system 100 taken along a line 2-2 of FIG. 3. The die pad 110 can include an internal die pad side 202 and an external die pad side 204 parallel with and facing away from the internal die pad side 202. The die internal conductive layer 134 is shown plated on the internal die pad side 202.

The internal die pad side 202 intersects the upper non-horizontal pad side 140 of the die pad 110. The upper non-horizontal pad side 140 of the die pad 110 can be non-horizontal and extend towards the external die pad side 204. The upper non-horizontal pad side 140 can be formed having a surface profile that is planar.

The external die pad side 204 can intersect a second non-horizontal pad side 206 of the die pad 110. The second non-horizontal pad side 206 is non-horizontal, extends towards the internal die pad side 202, and intersects the upper non-horizontal pad side 140. The second non-horizontal pad side 206 can be formed having a surface profile that is non-planar.

The first leads 104 can include a first inner surface 208 of the first external connection portion 118 and of the first internal connection portion 120. The first inner surface 208 can be coplanar with the internal die pad side 202. The first internal conductive layer 131 is shown plated on the first inner surface 208.

A first outer surface 210 of the first external connection portion 118 of the first leads 104 can be parallel with and facing away from the first inner surface 208. The first outer surface 210 can be coplanar with the external die pad side 204.

The first inner surface 208 intersects the first upper non-horizontal portion 136 of the first external connection portion 118. The first upper non-horizontal portion 136 can be non-horizontal and extend towards the first outer surface 210. The first upper non-horizontal portion 136 can be formed having a surface profile that is planar. The first upper non-horizontal portion 136 can be formed as a perimeter of the first leads 104.

The first outer surface 210 intersects a first lower non-horizontal portion 214 of the first external connection portion 118. The first lower non-horizontal portion 214 can be non-horizontal, extend towards the first upper non-horizontal portion 136, and intersect the first upper non-horizontal portion 136. The first lower non-horizontal portion 214 can be formed having a surface profile that is non-planar.

A first intermediate surface 216 can be formed on a side of the first leads 104 opposite the first inner surface 208 of the first internal connection portion 120. The first intermediate surface 216 can intersect the first lower non-horizontal portion 214 of the first external connection portion 118. The first intermediate surface 216 can be parallel to and facing away from the first inner surface 208.

The first intermediate surface 216 is oriented between a plane containing the first inner surface 208 and a plane containing the first outer surface 210. An edge of the first upper non-horizontal portion 136 furthest away from the first inner surface 208 of the first internal connection portion 120 intersects the first intermediate surface 216 of the first internal connection portion 120.

The second leads 106 can be similar to the first leads 104 except the second internal connection portion 122 of the second leads 106 can have a length different from a length of the first internal connection portion 120 of the first leads 104. The second leads 106 can include a second inner surface 218 of the second external connection portion 124 and of the second internal connection portion 122.

The second inner surface 218 can be coplanar with the internal die pad side 202. The second internal conductive layer 132 is shown plated on the second inner surface 218. A second outer surface 220 of the second external connection portion 124 of the second leads 106 can be parallel with and facing away from the second inner surface 218. The second outer surface 220 can be coplanar with the external die pad side 204.

The second inner surface 218 intersects the second upper non-horizontal portion 138 of the second external connection portion 124. The second upper non-horizontal portion 138 can be non-horizontal and extend towards the second outer surface 220. The second upper non-horizontal portion 138 can be formed having a surface profile that is planar. The second upper non-horizontal portion 138 can be formed as a perimeter of the second leads 106.

The second outer surface 220 intersects a second lower non-horizontal portion 224 of the second external connection portion 124. The second lower non-horizontal portion 224 can be non-horizontal, extend towards the second upper non-horizontal portion 138, and intersect the second upper non-horizontal portion 138. The second lower non-horizontal portion 224 can be formed having a surface profile that is non-planar.

A second intermediate surface 226 can be formed on a side of the second leads 106 opposite the second inner surface 218 of the second internal connection portion 122. The second intermediate surface 226 can intersect the second lower non-horizontal portion 224 of the second external connection portion 124. The second intermediate surface 226 can be parallel to and facing away from the second inner surface 218.

The second intermediate surface 226 is oriented between a plane containing the second inner surface 218 and a plane containing the second outer surface 220. An edge of the second upper non-horizontal portion 138 furthest away from the second inner surface 218 of the second internal connection portion 122 intersects the second intermediate surface 226 of the second internal connection portion 122.

The first leads 104 include a first external conductive layer 228 plated on the first outer surface 210. The second leads 106 include a second external conductive layer 230 plated on the second outer surface 220. The die pad 110 includes a die external conductive layer 232 plated on the external die pad side 204.

The first external conductive layer 228, the second external conductive layer 230, and the die external conductive layer 232 can improve conductive properties, connective properties, and oxidation resistance of the first leads 104, the second leads 106, and the die pad 110, respectively. Also, the first external conductive layer 228, the second external conductive layer 230, and the die external conductive layer 232 can be used as an etchant resist coating in formation of the first leads 104, the second leads 106, and the die pad 110, respectively.

The first external conductive layer 228, the second external conductive layer 230, and the die external conductive layer 232 can be formed using a pre-plated frame (PPF) process that includes a nickel-palladium-gold (NiPdAu) layering process or a layering process using conductive metals having characteristics similar to a combination of NiPdAu. The encapsulation 102 can cover the integrated circuit device 108, the internal interconnects 114, the first upper non-horizontal portion 136 of the first leads 104, the second upper non-horizontal portion 138 of the second leads 106, and the upper non-horizontal pad side 140 of the die pad 110.

A solder mask 250 can cover the first intermediate surface 216, the second intermediate surface 226, and the encapsulation 102 intersecting the first upper non-horizontal portion 136, the second upper non-horizontal portion 138, and the upper non-horizontal pad side 140. The solder mask 250 provides structural rigidity to the integrated circuit packaging system 100. The solder mask 250 can surround and protect the first lower non-horizontal portion 214, the second non-horizontal pad side 206, and the second lower non-horizontal portion 224.

The solder mask 250 can be formed from a solder resist material. The solder mask 250 can be in direct contact and coplanar with the perimeter sides 116 of the encapsulation 102. The solder mask 250 and the encapsulation 102 protect the contents of the integrated circuit packaging system 100.

The first external conductive layer 228, the second external conductive layer 230, and the die external conductive layer 232 are exposed from the solder mask 250. The first external conductive layer 228, the second external conductive layer 230, and the die external conductive layer 232 can be used to provide connectivity between the integrated circuit packaging system 100 and the next level of integration (not shown).

It has been discovered that the present invention provides the integrated circuit packaging system 100 with improved signal distribution. The first internal connection portion 120 and the second internal connection portion 122 provide the present invention with signal and wiring re-distribution flexibility without added costs and complexity resulting in shortened design and development schedules. The re-distribution flexibility of the first internal connection portion 120 and the second internal connection portion 122 formed by leveraging well known in the art etch and removal processes provides significant reductions in equipment ramp-up, in tooling, and in manufacturing process steps including elimination of the use of laminates with bismaleimide triazine (BT). A combination of the shortened design and development schedules, the reductions in equipment ramp-up, the reductions in tooling, the reductions in manufacturing process steps, and an opportunity to immediately deploy a workforce without re-training results in the improved product time to market capabilities over typical multiple row quad flat no lead packaging systems.

Referring now to FIG. 3, therein is shown a bottom view of the integrated circuit packaging system 100. The first external conductive layer 228, the second external conductive layer 230, and the die external conductive layer 232 are shown exposed from the solder mask 250.

Below the solder mask 250 and shown with dashed lines are the first leads 104, the first lower non-horizontal portion 214 of the first external connection portion 118, and the first intermediate surface 216 on the first internal connection portion 120 of the first leads 104. The first lower non-horizontal portion 214 is shown around the first external conductive layer 228 of the first leads 104.

Also shown with dashed lines below the solder mask 250 are the second leads 106, the second lower non-horizontal portion 224 of the second external connection portion 124, and the second intermediate surface 226 on the second internal connection portion 122 of the second leads 106. The second lower non-horizontal portion 224 is shown around the second external conductive layer 230.

The second non-horizontal pad side 206 of the die pad 110 of FIG. 1 is shown with dashed lines below the solder mask 250. The second non-horizontal pad side 206 is shown around the die external conductive layer 232. The first leads 104, the second leads 106, and the second non-horizontal pad side 206 are covered by and not exposed from solder mask sides 302 of the solder mask 250.

Figure 4:
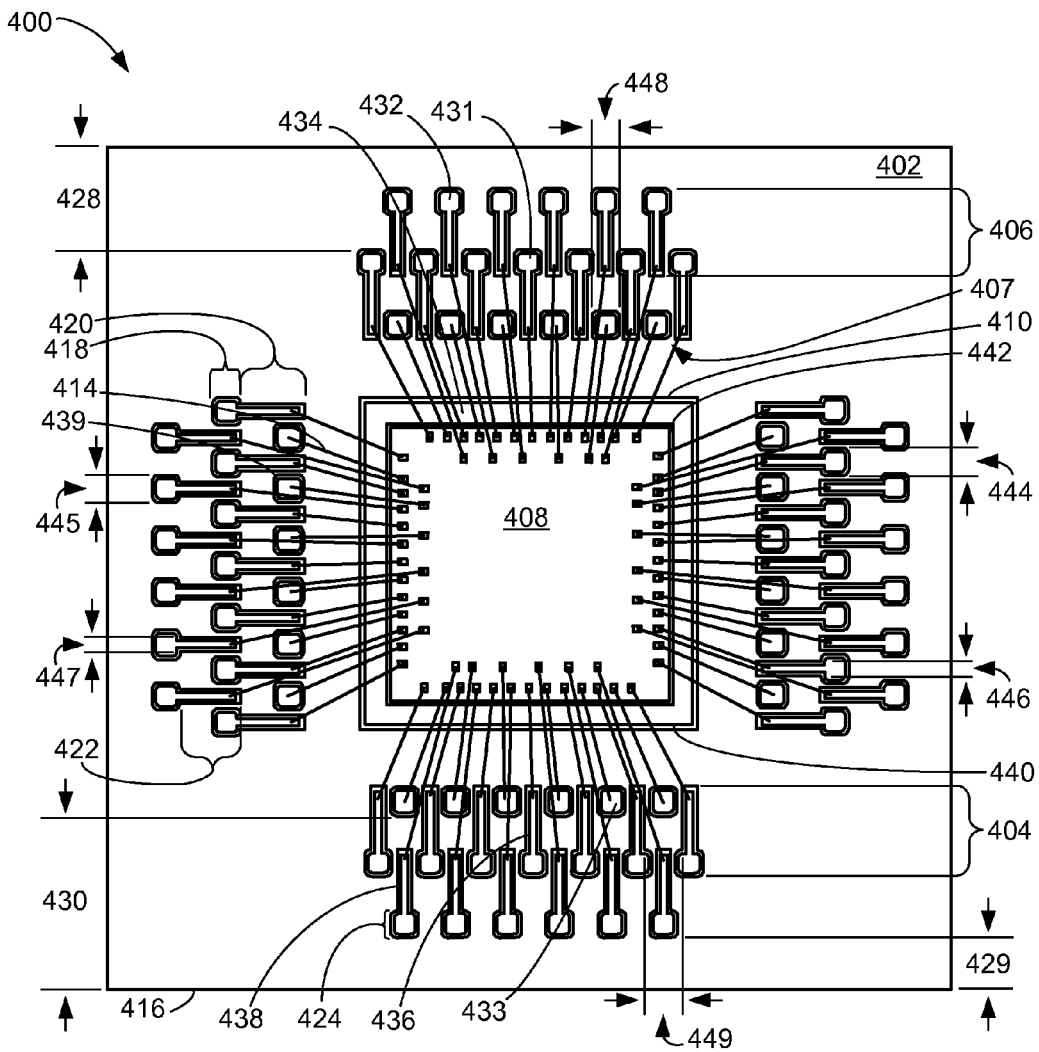
FIG. 4 is a top plan view of an integrated circuit packaging system in a second embodiment of the present invention.

Referring now to FIG. 4, therein is shown a top plan view of an integrated circuit packaging system 400 in a second embodiment of the present invention. The top plan view depicts the integrated circuit packaging system 100 without a portion of an encapsulation 402 to expose first leads 404, second leads 406, third leads 407, an integrated circuit device 408, a die pad 410, and internal interconnects 414.

The integrated circuit device 408 is an integrated circuit having a non-active side and an active side having circuitry fabricated thereon. The integrated circuit device 408 can include a wire bond chip, an integrated circuit module, or any integrated component having electronic circuitry.

The internal interconnects 414 is defined as an electrical structure for mechanically and electrically connecting two end points, and for use internal to the encapsulation 402 of the integrated circuit packaging system 400 but not part of the integrated circuit device 408. The encapsulation 402 is defined as a cover over the first leads 404, the second leads 406, the integrated circuit device 408, the die pad 410, and the internal interconnects 414. The encapsulation 402 also protects these portions of the integrated circuit packaging system 400 by providing a hermetic seal.

The first leads 404 can be formed from copper, conductive alloys, or of a material having properties similar to copper materials. The first leads 404 can be oriented adjacent the die pad 410 which can be formed of the same material used to form the first leads 404 and used to provide structural and conductive properties to the integrated circuit packaging system 400.

The first leads 404 are not attached to and extend perpendicularly from the die pad 410 towards perimeter sides 416 of the encapsulation 402 closest to the first leads 404. Each of the first leads 404 can include a first external connection portion 418 and a first internal connection portion 420.

The first external connection portion 418 can be closer to the peripheral of the integrated circuit packaging system 400 than the first internal connection portion 420. The first internal connection portion 420 can extend laterally from the first external connection portion 418 inward towards the die pad 410. The first internal connection portion 420 can be used to redistribute electrical signals or electrical potential levels from one location to a different location within the present invention.

The first external connection portion 418 of the first leads 404 can be oriented with a first offset 428. The first offset 428 is defined as a distance between the first external connection portion 418 and the perimeter sides 416 closest to the first external connection portion 418.

The second leads 406 can be oriented adjacent to, staggered to, and at alternating locations with the first leads 404. The second leads 406 can be formed from a material similar the material used to form the first leads 404. The second leads 406 are not attached to and extend perpendicularly from the die pad 410 towards the perimeter sides 416 of the encapsulation 402 closest to the second leads 406.

The second leads 406 can be formed to include a second external connection portion 424 and a second internal connection portion 422. The second external connection portion 424 can be closer to the peripheral of the integrated circuit packaging system 400 than the second internal connection portion 422.

The second internal connection portion 422 can extend laterally from the second external connection portion 424 inward towards the die pad 410 and have a length identical to a length of the first internal connection portion 420. The first internal connection portion 420 of the first leads 404 can be closer to the die pad 410 than the second internal connection portion 422 of the second leads 406.

The second external connection portion 424 can be oriented with a second offset 429. The second offset 429 is defined as a distance between the second external connection portion 424 and the perimeter sides 416 closest to the second external connection portion 424.

The third leads 407 can be formed between the first leads 404 and oriented between the second leads 406 and the die pad 410. The third leads 407 can be formed of the same material used to form the first leads 404. The third leads 407 can be similar to the first external connection portion 418 of the first leads 404 except for an omission of the first internal connection portion 420 of the first leads 404. The third offset 430 is defined as a distance between the third leads 407 and the perimeter sides 416 closest to the third leads 407.

The first offset 428 is different from the second offset 429 such that the first leads 404 are shown to form a central row of external connections with the first external connection portion 418 and the second leads 406 are shown to form an outer row of external connections with the second external connection portion 424.

The third offset 430 is different from both the second offset 429 and the first offset 428 such that the third leads 407 are shown to form an inner row of external connections along the central row of the external connections and the outer row of the external connections.

The first internal connection portion 420 of each of the first leads 404 and the third leads 407 can be equidistant from an edge of the die pad 410 closest to the third leads 407. The third leads 407 can be oriented between the second leads 406 and the die pad 410 closest to the second leads 406.

The second internal connection portion 422 and the first external connection portion 418 can be equidistant from the edge of the die pad 410 closest to the third leads 407, the first external connection portion 418, and the first internal connection portion 420. The third leads 407 can be oriented between the second leads 406 and the die pad 410.

The first leads 404 include a first internal conductive layer 431. The second leads 406 include a second internal conductive layer 432. The third leads 407 include a third internal conductive layer 433. The die pad 410 includes a die internal conductive layer 434.

The first internal conductive layer 431, the second internal conductive layer 432, the third internal conductive layer 433, and the die internal conductive layer 434 improves conductive properties, connective properties, and oxidation resistance of the first leads 404, the second leads 406, the third leads 407, and the die pad 410, respectively. Also the first internal conductive layer 431, the second internal conductive layer 432, the third internal conductive layer 433, and the die internal conductive layer 434 is used as an etchant resist coating to form the first leads 404, the second leads 406, the third leads 407, and the die pad 410, respectively.

The first internal conductive layer 431, the second internal conductive layer 432, the third internal conductive layer 433, and the die internal conductive layer 434 can be formed using a pre-plated frame (PPF) process that includes a nickel-palladium-gold (NiPdAu) layering process or a layering process using conductive metals having characteristics similar to a combination of NiPdAu. A first upper non-horizontal portion 436 of the first leads 404, a second upper non-horizontal portion 438 of the second leads 406, a third upper non-horizontal portion 439 of the third leads 407, and an upper non-horizontal pad side 440 of the die pad 410 are shown in the top plan view.

The top plan view depicts the first internal conductive layer 131 surrounded by the first upper non-horizontal portion 436 of the first leads 404. The top plan view depicts the second internal conductive layer 432 surrounded by the second upper non-horizontal portion 438 of the second leads 406.

The top plan view also depicts the third internal conductive layer 433 surrounded by the third upper non-horizontal portion 439 of the third leads 407. The top plan view further depicts the die internal conductive layer 434 surrounded by the upper non-horizontal pad side 440 of the die pad 410. The integrated circuit device 408 can be mounted over the die internal conductive layer 434 of the die pad 410 using an attachment layer 442 that can include an adhesive layer, a stacking adhesive, or a combination thereof.

The internal interconnects 414 can be used to electrically connect the active side of the integrated circuit device 408 with the first internal conductive layer 431 of the first leads 404, the second internal conductive layer 432 of the second leads 406, and the third internal conductive layer 433 of the third leads 407. One or more of the internal interconnects 414 could optionally be used to connect the integrated circuit device 408 to the die internal conductive layer 434 of the die pad 410.

Each of the internal interconnects 414 are shown having a minimized length resulting from connecting to near ends of the first internal connection portion 420 closest to the die pad 410, to near ends of the second internal connection portion 422 closest to the die pad 410, and to the third leads 407 close to the die pad 410. Some of the internal interconnects 414 could have been connected to the first internal conductive layer 431 or the second internal conductive layer 432 at any physical location to provide more than one of the internal interconnects 414 with equal lengths for electrical timing sensitive signals to or from the integrated circuit device 408.

A portion of the first external connection portion 418, the second external connection portion 424, and the third leads 407 protrude towards from a side of the integrated circuit packaging system 400 opposite the side facing the encapsulation 402. The portion of the first external connection portion 418, the second external connection portion 424, and the third leads 407 can be used to provide connectivity between the integrated circuit packaging system 400 and a next level of integration (not shown) such as a printed circuit board, an integrated circuit module, or a subsystem having electronics.

The first external connection portion 418 of each of the first leads 404 are staggered from the second external connection portion 424 of each of the second leads 406. A first external width 444 of the first external connection portion 418 can be at least twice a first internal width 446 of the first internal connection portion 420. A second external width 445 of the second external connection portion 424 can be at least twice a second internal width 447 of the second internal connection portion 422.

The first external width 444 is defined as a distance across a cross-section of the first external connection portion 418 perpendicular to a length of the first internal connection portion 420. The second external width 445 is defined as a distance across a cross-section of the second external connection portion 424 perpendicular to a length of the second internal connection portion 422. The second internal width 447 is defined as a distance across a cross-section of the second internal connection portion 422 perpendicular to a length of the second internal connection portion 422.

A third external width 448 of the third leads 407 can be less than a separation width 449. The separation width 449 is defined as a distance between the first internal connection portion 420 of one of the first leads 404 and the first internal connection portion 420 of yet another one of the first leads 404 closest to the one of the first leads 404. The third external width 448 can be equal to the first external width 444.

Figure 5:
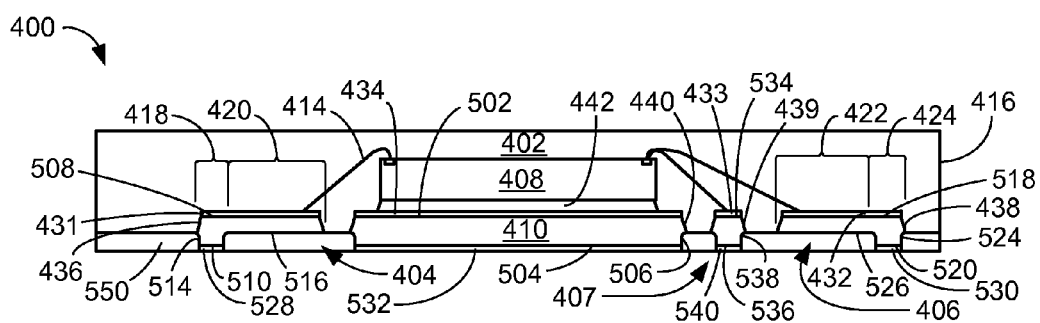
FIG. 5 is a cross-sectional view of the integrated circuit packaging system taken along a line 5-5 of FIG. 6.
Figure 6:
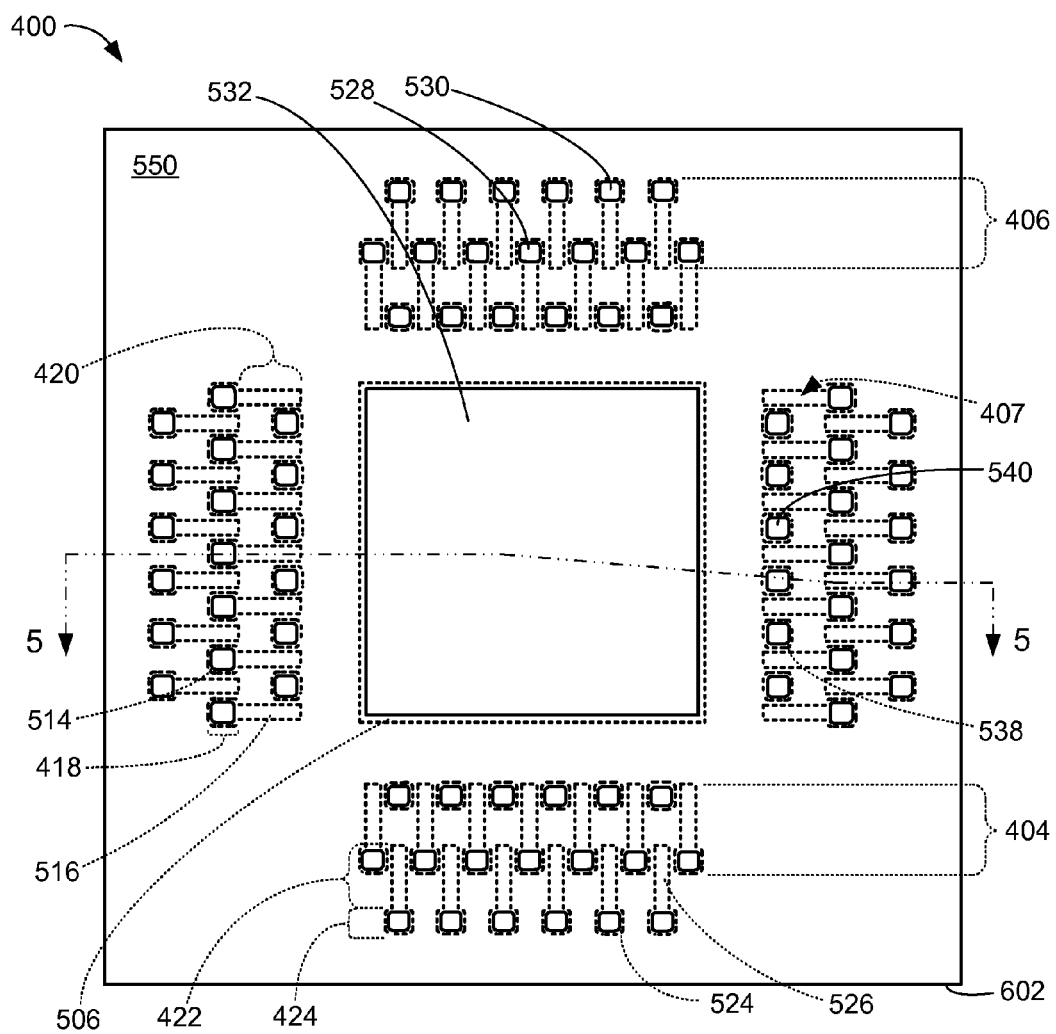
FIG. 6 is a bottom view of the integrated circuit packaging system.

Referring now to FIG. 5, therein is shown a cross-sectional view of the integrated circuit packaging system 400 taken along a line 5-5 of FIG. 6. The die pad 410 can include an internal die pad side 502 and an external die pad side 504 parallel with and facing away from the internal die pad side 502. The die internal conductive layer 434 is shown plated on the internal die pad side 502.

The internal die pad side 502 intersects the upper non-horizontal pad side 440 of the die pad 410. The upper non-horizontal pad side 440 of the die pad 410 can be non-horizontal and extend towards the external die pad side 504. The upper non-horizontal pad side 440 can be formed having a surface profile that is planar.

The external die pad side 504 can intersect a second non-horizontal pad side 506 of the die pad 410. The second non-horizontal pad side 506 is non-horizontal, extends towards the internal die pad side 502, and intersects the upper non-horizontal pad side 440. The second non-horizontal pad side 506 can be formed having a surface profile that is non-planar.

The first leads 404 can include a first inner surface 508 of the first external connection portion 418 and of the first internal connection portion 420. The first inner surface 508 can be coplanar with the internal die pad side 502. The first internal conductive layer 431 is shown plated on the first inner surface 508.

A first outer surface 510 of the first external connection portion 418 of the first leads 404 can be parallel with and facing away from the first inner surface 508. The first outer surface 510 can be coplanar with the external die pad side 504.

The first inner surface 508 intersects the first upper non-horizontal portion 436 of the first external connection portion 418. The first upper non-horizontal portion 436 can be non-horizontal and extend towards the first outer surface 510. The first upper non-horizontal portion 436 can be formed having a surface profile that is planar. The first upper non-horizontal portion 436 can be formed as a perimeter of the first leads 404.

The first outer surface 510 intersects a first lower non-horizontal portion 514 of the first external connection portion 418. The first lower non-horizontal portion 514 can be non-horizontal, extend towards the first upper non-horizontal portion 436, and intersect the first upper non-horizontal portion 436. The first lower non-horizontal portion 514 can be formed having a surface profile that is non-planar.

A first intermediate surface 516 can be formed on a side of the first leads 404 opposite the first inner surface 508 of the first internal connection portion 420. The first intermediate surface 516 can intersect the first lower non-horizontal portion 514 of the first external connection portion 418. The first intermediate surface 516 can be parallel to and facing away from the first inner surface 508.

The first intermediate surface 516 is oriented between a plane containing the first inner surface 508 and a plane containing the first outer surface 510. An edge of the first upper non-horizontal portion 436 furthest away from the first inner surface 508 of the first internal connection portion 420 intersects the first intermediate surface 516 of the first internal connection portion 420.

The second leads 406 can be similar to the first leads 404. The second leads 406 can include a second inner surface 518 of the second external connection portion 424 and of the second internal connection portion 422.

The second inner surface 518 can be coplanar with the internal die pad side 502. The second internal conductive layer 432 is shown plated on the second inner surface 518. A second outer surface 520 of the second external connection portion 424 of the second leads 406 can be parallel with and facing away from the second inner surface 518. The second outer surface 520 can be coplanar with the external die pad side 504.

The second inner surface 518 intersects the second upper non-horizontal portion 438 of the second external connection portion 424. The second upper non-horizontal portion 438 can be non-horizontal and extend towards the second outer surface 520. The second upper non-horizontal portion 438 can be formed having a surface profile that is planar. The second upper non-horizontal portion 438 can be formed as a perimeter of the second leads 406.

The second outer surface 520 intersects a second lower non-horizontal portion 524 of the second external connection portion 424. The second lower non-horizontal portion 524 can be non-horizontal, extend towards the second upper non-horizontal portion 438, and intersect the second upper non-horizontal portion 438. The second lower non-horizontal portion 524 can be formed having a surface profile that is non-planar.

A second intermediate surface 526 can be formed on a side of the second leads 406 opposite the second inner surface 518 of the second internal connection portion 422. The second intermediate surface 526 can intersect the second lower non-horizontal portion 524 of the second external connection portion 424. The second intermediate surface 526 can be parallel to and facing away from the second inner surface 518.

The second intermediate surface 526 is oriented between a plane containing the second inner surface 518 and a plane containing the second outer surface 520. An edge of the second upper non-horizontal portion 438 furthest away from the second inner surface 518 of the second internal connection portion 422 intersects the second intermediate surface 526 of the second internal connection portion 422.

The first leads 404 include a first external conductive layer 528 plated on the first outer surface 510. The second leads 406 include a second external conductive layer 530 plated on the second outer surface 520. The die pad 410 includes a die external conductive layer 532 plated on the external die pad side 504.

The first external conductive layer 528, the second external conductive layer 530, and the die external conductive layer 532 can improve conductive properties, connective properties, and oxidation resistance of the first leads 404, the second leads 406, and the die pad 410 respectively. Also, the first external conductive layer 528, the second external conductive layer 530, and the die external conductive layer 532 can be used as an etchant resist coating in formation of the first leads 404, the second leads 406, and the die pad 410 respectively The first external conductive layer 528, the second external conductive layer 530, and the die external conductive layer 532 can be formed using a pre-plated frame (PPF) process that includes a nickel-palladium-gold (NiPdAu) layering process or a layering process using conductive metals having characteristics similar to a combination of NiPdAu.

The third leads 407 can include a third inner surface 534 coplanar with the internal die pad side 502. The third internal conductive layer 433 can be plated on the third inner surface 534. A third outer surface 536 can be parallel with and facing away from the third inner surface 534. The third outer surface 536 can be coplanar with the external die pad side 504.

The third upper non-horizontal portion 439 intersects the third inner surface 534 and can be non-horizontal and extend towards the third outer surface 536. The third upper non-horizontal portion 439 can be formed having a surface profile that is planar. The third upper non-horizontal portion 439 is formed around a perimeter of the third inner surface 534.

The third outer surface 536 intersects a third lower non-horizontal portion 538. The third lower non-horizontal portion 538 can be non-horizontal, extend towards the third upper non-horizontal portion 439, and intersect the third upper non-horizontal portion 439.

The third lower non-horizontal portion 538 can be formed having a surface profile that is non-planar. The third lower non-horizontal portion 538 is formed around a perimeter of the third outer surface 536.

The third leads 407 include a third external conductive layer 540 plated on the third outer surface 536. The third external conductive layer 540 can improve conductive properties, connective properties, oxidation resistance, and be used as an etchant resist coating in formation of the third leads 407. The third external conductive layer 540 can be formed using a pre-plated frame (PPF) process that includes a nickel-palladium-gold (NiPdAu) layering process or a layering process using conductive metals having characteristics similar to a combination of NiPdAu.

The encapsulation 402 can cover the integrated circuit device 408, the internal interconnects 414, the first upper non-horizontal portion 436 of the first leads 404, the second upper non-horizontal portion 438 of the second leads 406, the third upper non-horizontal portion 439 of the third leads 407, and the upper non-horizontal pad side 440 of the die pad 410.

A solder mask 550 can cover the first intermediate surface 516, the second intermediate surface 526, and the encapsulation 402 intersecting the first upper non-horizontal portion 436, the second upper non-horizontal portion 438, the third upper non-horizontal portion 439, and the upper non-horizontal pad side 440. The solder mask 550 can surround and protect the first lower non-horizontal portion 514, the second lower non-horizontal portion 524, the third lower non-horizontal portion 538, and the second non-horizontal pad side 506.

The solder mask 550 can be formed from a solder resist material. The solder mask 550 can be in direct contact and coplanar with the perimeter sides 416 of the encapsulation 402. The solder mask 550 and the encapsulation 402 protect the contents of the integrated circuit packaging system 400.

The first external conductive layer 528, the second external conductive layer 530, the third external conductive layer 540, and the die external conductive layer 532 are exposed from the solder mask 550. The first external conductive layer 528, the second external conductive layer 530, the third external conductive layer 540, and the die external conductive layer 532 can be used to provide connectivity between the integrated circuit packaging system 400 and the next level of integration (not shown).

It has been discovered that the present invention provides the integrated circuit packaging system 400 with improvements in a package system integration layout. The first external conductive layer 528 on the first leads 404, the second external conductive layer 530 on the second leads 406, and the third external conductive layer 540 on the third leads 407 can be formed, distributed, and oriented over contacts, bumps, pads, probes, or system interconnects of the next level of integration (not shown). Placement of the first external connection portion 418, the second external connection portion 424, and the third leads 407 provides package interconnect customization and placement compatibility not available with typical leadframe based packages limited to standardized pitch and contact orientations.

Referring now to FIG. 6, therein is shown a bottom view of the integrated circuit packaging system 400. The first external conductive layer 528, the second external conductive layer 530, the third external conductive layer 540, and the die external conductive layer 532 are shown exposed from the solder mask 550.

Below the solder mask 550 and shown with dashed lines are the first leads 404, the first lower non-horizontal portion 514 of the first external connection portion 418, and the first intermediate surface 516 on the first internal connection portion 420 of the first leads 404. The first external conductive layer 528 can be plated on the first leads 404 in a perimeter formed by the first lower non-horizontal portion 514.

Also shown with dashed lines below the solder mask 550 are the second leads 406, the second lower non-horizontal portion 524 of the second external connection portion 424, and the second intermediate surface 526 on the second internal connection portion 422 of the second leads 406. The second external conductive layer 530 can be plated on the second leads 406 in a perimeter formed by the second lower non-horizontal portion 524.

The third leads 407 and the third lower non-horizontal portion 538 are shown with hidden lines below the solder mask 550. The third external conductive layer 540 can be plated on the third leads 407 in a perimeter formed by the third lower non-horizontal portion 538.

The second non-horizontal pad side 506 of the die pad 410 of FIG. 4 is shown with dashed lines below the solder mask 550. The die external conductive layer 532 can be plated on the die pad 410 in a perimeter formed by the second non-horizontal pad side 506. The first leads 404, the second leads 406, and the third leads 407 are covered by and not exposed from the solder mask sides 602.

Figure 7:
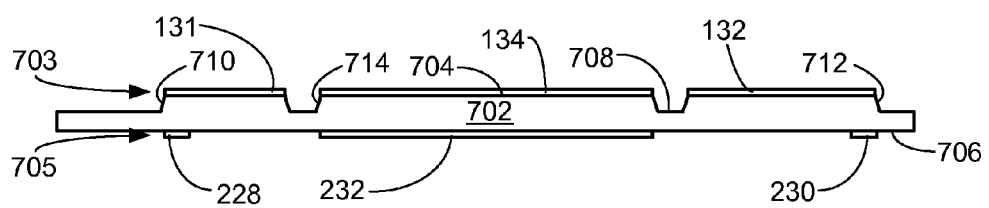
FIG. 7 is the structure of FIG. 2 in a layout forming phase of manufacture.

Referring now to FIG. 7, therein is shown the structure of FIG. 2 in a layout forming phase of manufacture. Shown is a conductive panel 702 having a primary side 704 and a secondary side 706. The conductive panel 702 can be formed from a conductive etchable material that can include a copper or a copper alloy material.

Primary mask patterns 703 having the first internal conductive layer 131, the second internal conductive layer 132, and the die internal conductive layer 134 can be plated on the primary side 704 during a plating phase. The plating phase can include the use of a plating process such as an electroplating, a diffusion, a precipitation, or a vaporization process.

The first internal conductive layer 131 can form a mask on the primary side 704 having an outline identical to an outline of the first inner surface 208 of FIG. 2. The second internal conductive layer 132 can form a mask on the primary side 704 having an outline of the second inner surface 218 of FIG. 2. The die internal conductive layer 134 can form a mask on the primary side 704 having an outline of the internal die pad side 202 of FIG. 2.

Secondary mask patterns 705 having the first external conductive layer 228, the second external conductive layer 230, and the die external conductive layer 232 can be plated directly on the secondary side 706 using the plating process. The first external conductive layer 228 can form a mask on the secondary side 706 having an outline identical to an outline of the first outer surface 210.

The second external conductive layer 230 can form a mask on the secondary side 706 having an outline identical to an outline of the second outer surface 220 of FIG. 2. The die external conductive layer 232 can form a mask on the secondary side 706 having an outline identical to an outline of the external die pad side 204 of FIG. 2.

The primary side 704 can be partially etched using an etching process. The etching process can include a chemical etch, a photo etching process, or a combination thereof. The etching results in a portion of material of the primary side 704 surrounding the first internal conductive layer 131, the second internal conductive layer 132, and the die internal conductive layer 134 removed and a formation of a lower surface 708 in the conductive panel 702.

The lower surface 708 can be parallel to the secondary side 706 and oriented between the primary side 704 and the secondary side 706. A first sloped side 710 of the conductive panel 702 intersecting a perimeter of the first internal conductive layer 131 can be planar and form an obtuse angle relative to the lower surface 708.

A second sloped side 712 of the second internal conductive layer 132 can be planar and form an obtuse angle relative to the lower surface 708. A die sloped side 714 can be planar and form an obtuse angle relative to the lower surface 708. The result of the etching of the primary side 704 is a relief, such as an outline or modeled form, of the layout, routing, and planar dimension of connector leads and a die paddle.

Figure 8:
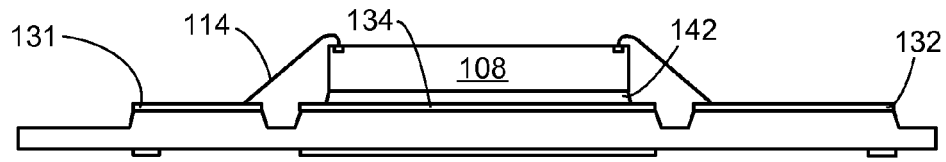
FIG. 8 is the structure of FIG. 7 in an assembly connecting phase.

Referring now to FIG. 8, therein is shown the structure of FIG. 7 in an assembly connecting phase. The integrated circuit device 108 is mounted over the die internal conductive layer 134 of the die pad 110 using the attachment layer 142 using a mounting process that can include bonding or glueing. The internal interconnects 114 connect an active side of the integrated circuit device 108 with the first internal conductive layer 131 and with the second internal conductive layer 132 using a connecting process that can include thermo-compression, ultrasonic, thermo-sonic, wedge bonding, wire bonding, ball bonding, solder reflowing, or similar connection processes.

Figure 9:
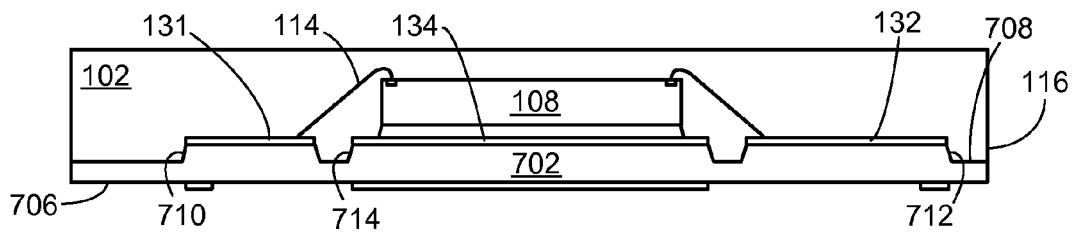
FIG. 9 is the structure of FIG. 8 in an encapsulating phase.

Referring now to FIG. 9, therein is shown the structure of FIG. 8 in an encapsulating phase. The lower surface 708, the integrated circuit device 108, the internal interconnects 114, the first internal conductive layer 131, the second internal conductive layer 132, and the die internal conductive layer 134 can be covered by the encapsulation 102 using a molding or encapsulating process.

The encapsulation 102 covers the first sloped side 710, the second sloped side 712, and the die sloped side 714. The secondary side 706 and edges of the conductive panel 702 can be exposed from the encapsulation 102. The perimeter sides 116 of the encapsulation 102 are can be formed perpendicular to the lower surface 708 during the encapsulation process and intersect the edges of the conductive panel 702.

Figure 10:
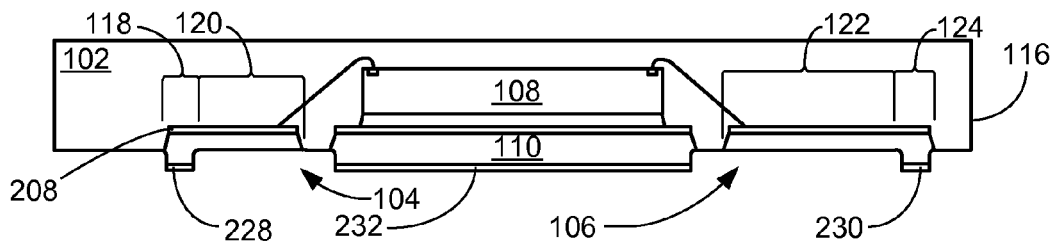
FIG. 10 is the structure of FIG. 9 in a frame removal phase.

Referring now to FIG. 10, therein is shown the structure of FIG. 9 in a frame removal phase. Portions of the conductive panel 702 of FIG. 9 from the lower surface 708 of FIG. 9 to the secondary side 706 surrounding the first external conductive layer 228, the second external conductive layer 230, and the die external conductive layer 232 can be removed to expose the encapsulation 102 using the etching process.

The etching process results in the formation of the first leads 104, the second leads 106, and the die pad 110. The first leads 104, the second leads 106, and the die pad 110 are surrounded by the perimeter sides 116 of the encapsulation 102.

Figure 11:
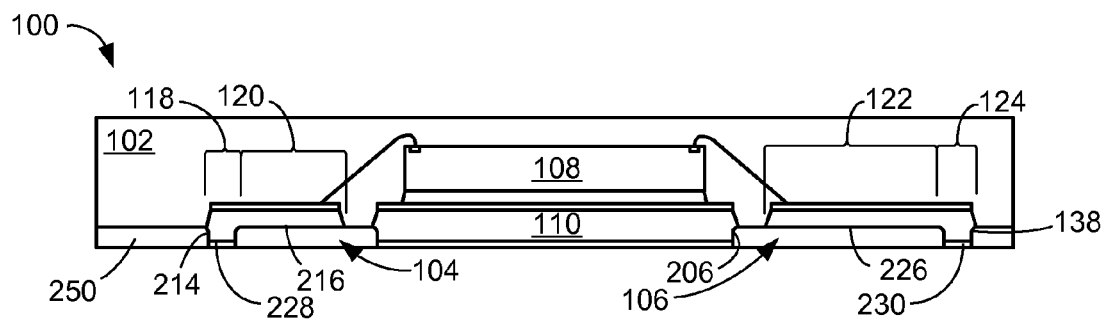
FIG. 11 is the structure of FIG. 10 in a masking phase.

Referring now to FIG. 11, therein is shown the structure of FIG. 10 in a masking phase. The solder mask 250 can be applied on the first intermediate surface 216, the second intermediate surface 226, and surround the die pad 110, the first leads 104, and the second leads 106 during a masking phase. The first external conductive layer 228, the second external conductive layer 230, and the die external conductive layer 232 can be exposed from the solder mask 250.

The masking phase can include the use of a diffusion, a precipitation, or a vaporization process. The encapsulation 102 intersecting the first lower non-horizontal portion 214, the first intermediate surface 216, the second non-horizontal pad side 206 can be covered by the solder mask 250 resulting in the formation of the integrated circuit packaging system 100.

It has been discovered that the present invention simplifies physical design layout of packages. Flexible orientation combinations of the first internal connection portion 120, the first external connection portion 118, the second internal connection portion 122, and the second external connection portion 124 provides the integrated circuit packaging system 100 with both a simplified physical design and layout enabling designs to accommodate clustering, patterning, isolation, and congestion avoidance of wiring within the integrated circuit packaging system 100.

Figure 12:
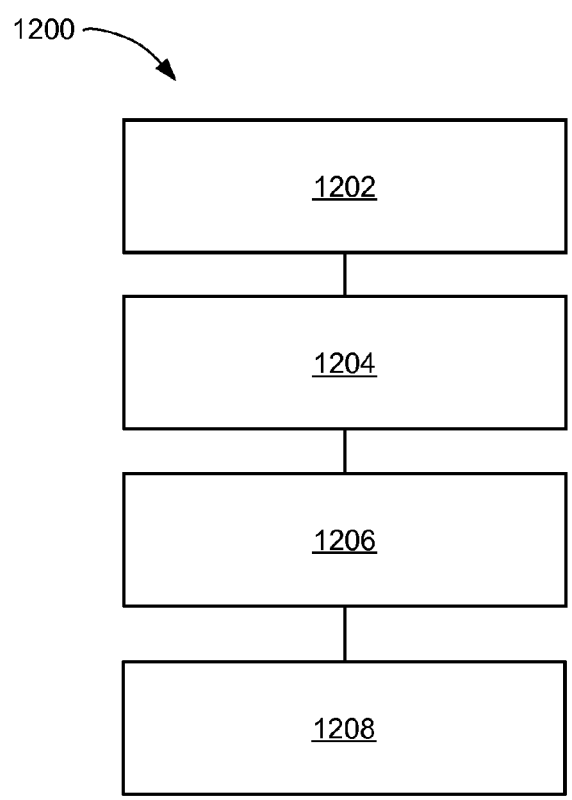
FIG. 12 is a flow chart of a method of manufacture of the integrated circuit packaging system in a further embodiment of the present invention.

Referring now to FIG. 12, therein is shown is a flow chart of a method 1200 of manufacture of the integrated circuit packaging system (100) in a further embodiment of the present invention. The method 1200 includes forming a first lead adjacent and staggered to a second lead, the first lead having a first external connection portion with a first external conductive layer and a first internal connection portion, the first external connection portion oriented laterally outwards from the first internal connection portion, and the second lead having a second external connection portion with a second external conductive layer and a second internal connection portion in a block 1202; connecting an integrated circuit device with the first internal connection portion and with the second internal connection portion in a block 1204; forming an encapsulation over the integrated circuit device with the first lead and the second lead exposed in a block 1206; and forming a solder mask on the encapsulation, on the first lead, and on the second lead with the first external conductive layer and the second external conductive layer exposed from the solder mask in a block 1208.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a first lead adjacent and staggered to a second lead,
        the first lead having a first external connection portion with a first external conductive layer and a first internal connection portion, the first external connection portion oriented laterally outwards from the first internal connection portion, and
        the second lead having a second external connection portion with a second external conductive layer and a second internal connection portion;
    forming a third lead adjacent to the first internal connection portion and the second internal connection portion along adjacent sides of the third lead;
    connecting an integrated circuit device with the first internal connection portion, with the third lead, and with the second internal connection portion;
    forming an encapsulation over the integrated circuit device with the first lead, the second lead, the third lead, the first external connection portion, and the second external connection portion exposed; and
    forming a solder mask on the encapsulation, on the first lead, and on the second lead with the first external conductive layer and the second external conductive layer exposed from the solder mask.

2. The method as claimed in claim 1 wherein forming the first lead includes forming the second external connection portion having a second external width at least twice a second internal width of the second internal connection portion.

3. The method as claimed in claim 1 wherein forming the first lead includes the forming the second external connection portion oriented laterally outwards from the second internal connection portion.

4. The method as claimed in claim 1 further comprising:
    forming a die pad; and
    wherein:
    forming the first internal connection portion and the second internal connection portion includes forming the first internal connection portion and the second internal connection portion equidistant from the die pad.

5. The method as claimed in claim 1 further comprising:
    forming a die pad; and
    wherein:
    forming the first lead includes forming a third lead between the second lead and the die pad.

6. A method of manufacture of an integrated circuit packaging system comprising:
    forming a first lead adjacent and staggered to a second lead,
        the first lead having a first external connection portion with a first external conductive layer and a first internal connection portion, the first external connection portion oriented laterally outwards from the first internal connection portion and having a first external width at least twice a first internal width of the first internal connection portion, and
        the second lead having a second external connection portion with a second external conductive layer and a second internal connection portion;
    forming a third lead adjacent to the first internal connection portion and the second internal connection portion along adjacent sides of the third lead;
    connecting an integrated circuit device with the first internal connection portion, with the third lead, and with the second internal connection portion;
    forming an encapsulation over the integrated circuit device with the first external connection portion and the second external connection portion exposed from the encapsulation; and
    forming a solder mask on the encapsulation, on the first lead, and on the second lead with the first external conductive layer and the second external conductive layer exposed from the solder mask.

7. The method as claimed in claim 6 wherein:
    forming the first lead adjacent and staggered to the second lead includes forming the second lead having the second internal connection portion covered with a second internal conductive layer; and
    connecting the integrated circuit device includes connecting the integrated circuit device with the second internal conductive layer.

8. The method as claimed in claim 6 wherein:
    forming the first lead includes forming the first lead having the first internal connection portion covered with a first internal conductive layer; and
    connecting the integrated circuit device includes connecting the integrated circuit device with the first internal conductive layer.

9. The method as claimed in claim 6 wherein forming the first lead includes forming a third lead having a third external width equal to the first external width of the first lead.

10. An integrated circuit packaging system comprising:
    a first lead having a first external connection portion with a first external conductive layer and a first internal connection portion, the first external connection portion oriented laterally outwards from the first internal connection portion;
    a second lead formed adjacent and staggered to the first lead, the second lead having a second external connection portion with a second external conductive layer and a second internal connection portion;
    a third lead formed adjacent to the first internal connection portion and the second internal connection portion along adjacent sides of the third lead;
    an integrated circuit device connected with the first internal connection portion, with the third lead, and with the second internal connection portion;
    an encapsulation formed over the integrated circuit device with the first lead and the second lead exposed, the first external connection portion and the second external connection portion exposed from the encapsulation; and
    a solder mask formed on the encapsulation, on the first lead, and on the second lead with the first external conductive layer and the second external conductive layer exposed from the solder mask.

11. The system as claimed in claim 10 wherein the second external connection portion has a second external width at least twice a second internal width of the second internal connection portion.

12. The system as claimed in claim 10 wherein the second external connection portion includes the second external connection portion oriented laterally outwards from the second internal connection portion.

13. The system as claimed in claim 10 further comprising:
a die pad; and
wherein:
   the first internal connection portion and the second internal connection portion includes the first internal connection portion and the second internal connection portion are equidistant from the die pad.

14. The system as claimed in claim 10 further comprising:
a die pad; and
a third lead between the second lead and the die pad.

15. The system as claimed in claim 10 wherein:
the second lead includes a second internal conductive layer covering the second internal connection portion; and
the integrated circuit device is connected to the second internal conductive layer.

16. The system as claimed in claim 10 wherein:
the first lead includes a first internal conductive layer covering the first internal connection portion; and
the integrated circuit device is connected to the first internal conductive layer.

17. The system as claimed in claim 10 further comprising a third lead having a third external width equal to the first external width of the first lead.

* * * * *